(12) United States Patent
Tanaka

(10) Patent No.: US 7,843,212 B2
(45) Date of Patent: Nov. 30, 2010

(54) DIFFERENTIAL CIRCUIT WITH PRECISELY CONTROLLED TERMINATOR CIRCUIT

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/073,571

(22) Filed: Mar. 6, 2008

(65) Prior Publication Data
US 2008/0240739 A1  Oct. 2, 2008

(30) Foreign Application Priority Data
Mar. 12, 2007  (JP) .............................. 2007-062404

(51) Int. Cl.
*H03K 17/16* (2006.01)
*H03K 19/003* (2006.01)
(52) U.S. Cl. .............................. 326/30; 326/21; 326/27
(58) Field of Classification Search .................. 326/21, 326/26–27, 30
See application file for complete search history.

(56) References Cited

U.S. PATENT DOCUMENTS

| | | | | |
|---|---|---|---|---|
| 5,047,657 A | * | 9/1991 | Seevinck et al. ............ | 327/306 |
| 5,680,060 A | * | 10/1997 | Banniza et al. .............. | 326/30 |
| 5,726,582 A | * | 3/1998 | Hedberg ...................... | 326/30 |
| 6,133,755 A | * | 10/2000 | Huang et al. ................. | 326/83 |
| 6,414,512 B1 | * | 7/2002 | Moyer .......................... | 326/30 |
| 6,556,038 B2 | * | 4/2003 | Kim et al. .................... | 326/30 |
| 6,605,958 B2 | * | 8/2003 | Bergman et al. ............. | 326/30 |
| 6,664,814 B1 | * | 12/2003 | Evans et al. .................. | 327/65 |
| 6,909,305 B1 | * | 6/2005 | Li et al. ....................... | 326/30 |
| 7,102,200 B2 | * | 9/2006 | Fan et al. ..................... | 257/379 |
| 7,230,449 B2 | * | 6/2007 | Dreps et al. .................. | 326/30 |
| 7,391,231 B2 | * | 6/2008 | Gomez et al. ................ | 326/30 |
| 2002/0145443 A1 | | 10/2002 | Partow et al. | |
| 2004/0008054 A1 | * | 1/2004 | Lesea et al. ................. | 326/30 |
| 2005/0168285 A1 | * | 8/2005 | Chiang ....................... | 330/259 |

FOREIGN PATENT DOCUMENTS

WO          95/24089          9/1995

* cited by examiner

*Primary Examiner*—James H. Cho
*Assistant Examiner*—Jason Crawford
(74) *Attorney, Agent, or Firm*—Smith, Gambrell & Russell, LLP

(57) ABSTRACT

The present invention provides a precisely controlled terminator circuit of a differential amplifier, in particular, for a differential amplifier of an optical receiver. The differential circuit, which receives a differential signal by a first input for the normal phase signal and a second input for an anti-phase signal, provides a terminator circuit comprises two resistors connected in serial between two inputs and two resistive connections each including a transistor and a resistor serially connected to the transistor and connected between respective inputs and the power supply line Vcc. The control unit, by receiving a medium potential of two resistors, provides a bias to two transistors so as to equalize the medium potential with the reference potential.

5 Claims, 5 Drawing Sheets

DIFFERENTIAL CIRCUIT WITH PRECISELY CONTROLLED TERMINATOR CIRCUIT

BACKGROUND OF THE INVENTION

1. Field of the Invention

The present invention relates to a differential circuit with a dynamically and precisely controller terminator circuit, in particular, relates to a differential circuit used in an optical receiver.

2. Related Prior Art

Recent high speed communication system requests a termination resistor for an electronic circuit dynamically and precisely controlled. A United States Patent publication 20020145443 has disclosed an example of the termination circuit. FIG. 5 shows a conventional termination circuit 100 disclosed in the publication above, where the circuits 100 terminates the transmission line 101 and includes a resistor unit 102 and a reference unit 103. The resistor unit 102 includes a resistor 102a and an FET 102b connected in serial between the transmission line 101 and the ground. The FET 102b operates as a variable resistor. The reference unit 103 includes a resistor 103a and another FET 103b connected in serial to the resistor 103a, between the power supply line $V_{DD}$ and the ground, and also operates as a variable resistor. The terminator circuit 100 also provides a current source between the reference unit 103 and the ground. The operational amplifier 105 receives the node potential between the current source 104 and the reference unit 103, and provides the gate bias to the FET 103b so as to equalize the node potential above with the reference Vref. That is, the operational amplifier 105 varies the equivalent resistance of the FET 103b such that the voltage drop generated by the current from the current source 104 multiplied by the serial circuit of the FET 103b and the resistor 103a becomes equal to the difference between the power supply $V_{DD}$ and the reference $V_{REF}$. This gate bias, determined by the feedback loop of the operational amplifier 105 and the reference unit 103, is also sent to the resistor unit 102 to dynamically vary the equivalent resistance of the FET 102b. Thus, the resistance of the resistor unit, which is a sum of the resistance of the resistor 102b and the equivalent resistance of the transistor 102b, may be stabilized in a preset value.

A PCT application, internationally published as WO95/24089, has also disclosed a termination circuit similar to those explained above.

However, the termination circuit 100 illustrated in FIG. 5 excludes a practical termination resistor in the resistor unit 102 from the feedback loop constituted including the operational amplifier 105. Consequently, when the resistance of the transistors, 102b and 103b, or the resistors, 102a and 103a, unbalance by various factors such as the process instability or the inherent temperature dependence of the device, or when the power supply $V_{DD}$ fluctuates, the accuracy of the termination resistance deteriorates.

SUMMARY OF THE INVENTION

A differential circuit of the present invention includes a termination circuit for positive and negative phase signals. A first input terminal of the termination circuit receives the positive phase signal, while a second input terminal of the termination circuit receives the negative phase signal. The termination circuit further provides first and second resistive connections, a current source and a control unit. The first resistive connection includes a first transistor and a first resistor, while, the second resistive connection includes a second transistor and a second resistor. The first transistor in the first resistive connection is connected between a first bias supply and the first input terminal, and the first resistor is connected between the first input terminal and the second resistor in the second resistive connection. The second transistor is connected between the first bias supply and the second input terminal, and the second resistor is connected between the second input terminal and the first resistor in the first resistive connection. Thus, the first input terminal, the second input terminal and the first bias supply constitute a triangular connection by the first and second resistive connections. The current source is connected between the first and second resistors so as to pull currents from the first and second resistive connection to a second bias supply different from the first bias supply, or to provide currents to both resistive connections from the second bias supply. The control unit controls the equivalent resistance of the first and second transistors by adjusting the gate bias of the transistors so as to equalize a voltage of the medium node with a reference voltage.

In the termination circuit of the invention, the first transistor operates as a termination resistor for the first input terminal, the second transistor operates as a termination resistor for the second input terminal, and the first and second resistors operates as a termination resistor between the first and second input terminals. Moreover, the voltage of the medium node is determined by the current from the current source multiplied by the equivalent resistance of two transistors, which are connected in parallel between the medium node and the first bias supply, and the control unit adjusts the voltage of the medium node so as to be equal to the reference voltage. Thus, the control unit equivalently adjusts the equivalent resistance of the transistors so as to maintain a preset value equal to the termination resistance of respective input terminals, which may precisely control the termination resistance independent of the variation of the resistors and the fluctuation in the power supply.

The termination circuit of the invention may further include third and fourth resistors each connected between the first transistor and the first input terminal, and between the second transistor and the second input terminal. The termination resistor for the first input terminal includes a series connection of the first transistor and the third resistor, while that for the second input terminal includes the second transistor and the fourth resistor connected in series to the second transistor. According to the configuration above, an adjustable range of the termination resistance solely determined by two transistors may be narrower, which enhances the preciseness of the termination resistance.

BRIEF DESCRIPTION OF DRAWINGS

FIG. 3 shows the relation of the return loss of the differential circuit 1a for the factor a;

DESCRIPTION OF PREFERRED EMBODIMENTS

Next, preferred embodiments according to the present invention will be described as referring to accompanying drawings. In the description, the same elements will be refereed by the same numerals or the symbols without overlapping explanations.

First Embodiment

Figure 1:
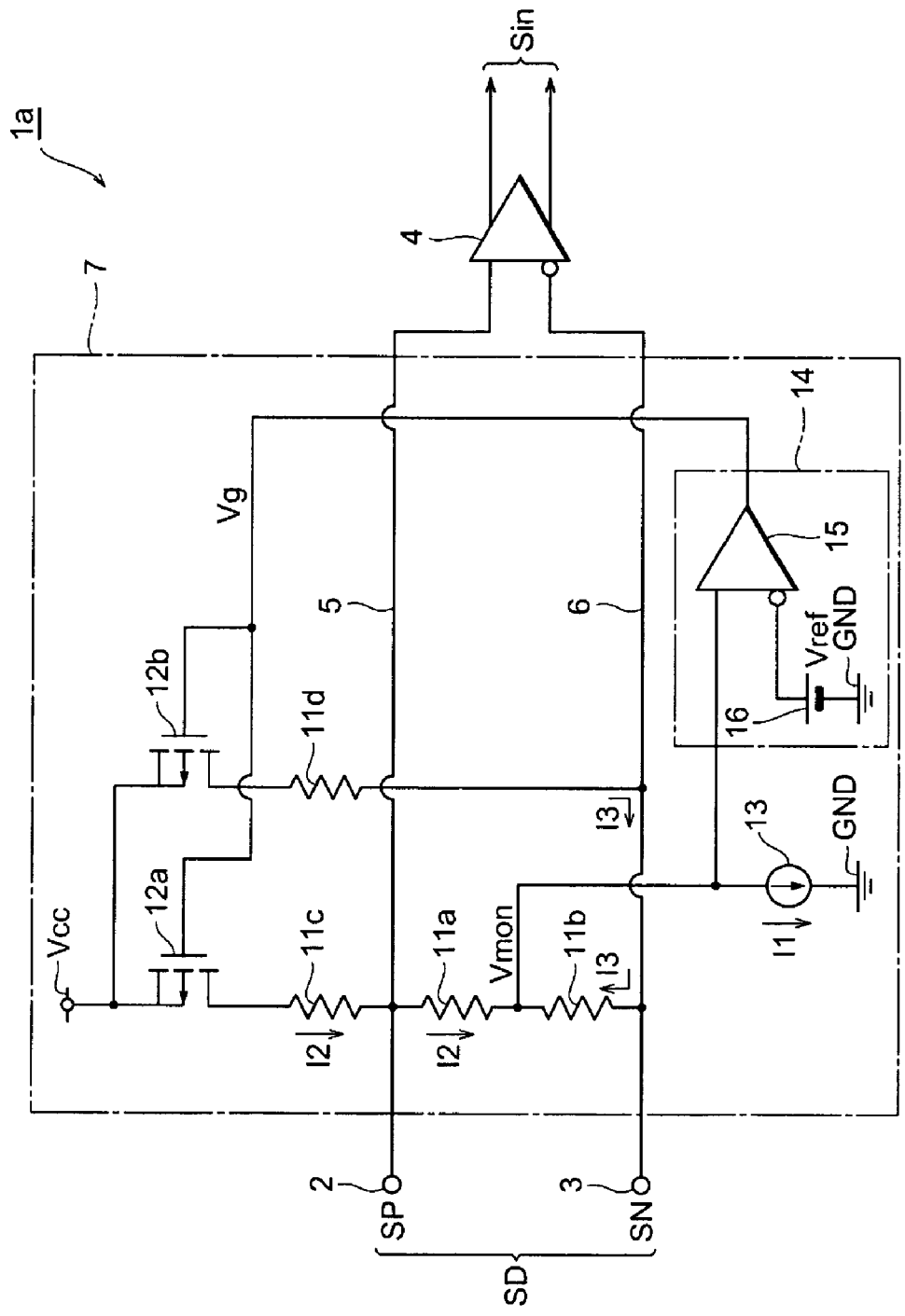
FIG. 1 shows a circuit diagram of a differential circuit according to the first embodiment of the present invention.

FIG. 1 shows a circuit diagram of a differential circuit according to the first embodiment of the invention. The differential circuit 1a, which processes the differential signal SD, provides a first terminal 2 to receive the positive phase signal SP of the differential signal SD, a second terminal 3 to receive the negative phase signal SN, an amplifier 4 to amplify the differential signal SD, and a terminator to terminate a signal line 5 to connect the first terminal 2 with the amplifier 4 and another signal line 6 to connect the second terminal 3 with the amplifier 5. The differential circuit 1a shown in FIG. 1 is preferred to be integrated within the IC.

The terminator circuit 7 comprises first to fourth resistors, 11a to 11d, two transistors, 12a and 12b, a current source 13 and a control unit 14. Resistors, 11a to 11d, may be a film resistor integrated within the IC.

Two resistors, 11a and 11b, are connected in series between the first and second terminals, namely, between the signal line 5 and the other signal line 6, which operate as the terminator between the first and second terminals. The resistance of these resistors, 11a and 11b, is identical to each other. Accordingly, the medium node of the resistors, 11a and 11b, shows just the medium potential Vmon between the first and second terminals, 2 and 3. Because the signals each input to the first and second terminals, 2 and 3, are the positive phase signal SP and the negative phase signal SN of the differential signal, the potential Vmon of the medium node becomes substantially independent of the differential signal, namely, the medium potential Vmon may be kept substantially constant.

The first transistor 12a operates as a variable resistor connected between the first terminal 2 and the positive power line Vcc. Specifically, the transistor 12a is connected in the drain terminal thereof with the first signal line 5, while the source terminal thereof is connected with the positive power supply Vcc. The present differential circuit is 1a provides the third resistor 11c in serial to the first transistor 12a, namely, the drain terminal of the first transistor 12a is connected to the first signal line via the resistor 11c. Thus, the first terminal 2 is terminated with the series circuit of the transistor 12a and the resistor 11c.

The other transistor, the second transistor 12b in the present embodiment, operates as a variable resistor connected between the second terminal 3 and the positive power supply Vcc. Specifically, the transistor 12b is connected in the drain terminal thereof with the second signal line 6, while, the source terminal thereof is connected to the positive power supply Vcc. The present embodiment provides the fourth resistor 11d connected between the drain terminal of the second transistor 12b and the second signal line 6; accordingly, the second terminal 3 is terminated with the series circuit of the fourth resistor 11d and the second transistor 12b.

These transistors, 12a and 12b, are integrated within the IC chip by the same configuration, namely, having the same gate length and the same gate width. The embodiment shown in FIG. 1 explicitly shows the p-MOS FET for these transistors, 12a and 12b. However, the invention may use other types of devices, such as n-MOSFET and Bipolar transistor. Moreover, resistors connected in series with these p-MOSFETs may be connected between the source terminal of the transistors, 12a and 12b, and the positive power supply Vcc.

The constant current source 13, connected between the medium node of the resistors, 11a and 11b, and the other power supply, the ground line in the embodiment shown in FIG. 1, sinks current $I_1$ from the medium node. The terminator circuit 7 equivalently provides resistive is connection including the first transistor 12a, two resistors, 11a and 11c, between the positive power supply Vcc and the medium node, while, the other resistive connection including the second transistor 12b, other two resistors, 11b and 11d, between the power supply Vcc and the medium node, and the resistance of these two resistive connections are set to be substantially equal to each other. Therefore, currents each flowing in the first resistive connection and in the second resistive connection become just half of the current, $I1/2$, determined by the current source 13. The current $I_1$ of the current source is preferably independent of the ambient temperature of the differential circuit 1a and the magnitude of the power supply Vcc.

The control unit 14 provides the gate bias Vg to the transistors, 12a and 12b. That is, the control unit 14 receives the medium potential Vmon between two resistors 11a and 11b, and generates the gate bias Vg so as to set this medium potential Vmon equal to a reference potential Vref. The control unit 14 of the present embodiment includes a differential circuit 15 whose non-inverting input receives the medium potential Vmon, while the inverting input of the differential circuit receives reference potential Vref. Thus, the differential circuit 15 outputs the gate bias Vg so as to the medium potential Vmon becomes equal to the reference potential Vref. The equivalent resistance between the drain and source terminals of the transistors, 12a and 12b, depends on the gate bias Vg, namely, the equivalent resistance between two terminals becomes large as the gate bias increases, while it becomes small as the gate bias decreases.

Next, a function of the differential circuit 1a will be described. Assuming the resistance of the resistors, 11a and 13b, are is equal to Rab/2, the combined resistance of the first transistor 12a and the resistor 11c is Rac, and the combined resistance of the second transistor 12b and the resistor 11d is Rbc, which is equal to the other combined resistance Rac, the equivalent resistance Rx between the medium node and the positive power supply Vcc becomes:

$$Rx = (Rac + Rab/2)/2 \quad (1)$$

When the signal appeared in two input terminals, 2 and 3, is a differential signal, the medium node voltage between resistors, 11a and 11b, becomes the substantially constant, where the medium potential Vmon appears no influence on the signal and determined solely by the current flowing in the first resistive connection, the first transistor 12a and two resistors, 11a and 11c, and the second resistive connection, the second transistor 12b and other two resistors, 11b and 11d. In other words, the medium potential Vmon shows a value reflecting the equivalent resistance between the drain and the source terminals of the transistors, 12a and 12b. The terminator circuit 7 makes the medium potential Vmon stable by comparing the medium potential Vmon with the reference potential Vref and the equivalent resistance of respective transistors, 12a and 12b, are adjusted so as to equalize these two potentials, Vmon and Vref.

The reference potential Vref is set to a value reduced by the target potential Vtarget from the power supply Vcc. The target potential Vtarget is set nearly equal to a product of the resistance Rx shown above multiplied by the current I1.

The terminating resistance Rdiff of the terminator circuit 7 is denoted as:

$$Rdiff = Rab \,//\, (Rac + Rbc) \quad (2)$$
$$= \frac{Rab \times (Rac + Rbc)}{Rab + Rac + Rbc}$$
$$= \frac{2 \times Rab \times Rac}{2 \times Rac + Rab}$$

by the Δ-Y conversion. Assuming that the normalized range of the resistance, which may be scattered by the process instability, is between 0.7 to 1.3, where 1.0 means a value of the design center, and taking this scattering of the resistance Rac of the resistive connection, the termination resistance Rdiff shown in equation (2) becomes:

$$Rdiff_2 = \frac{2 \times a \times Rab \times Rac_2}{2 \times Rac_2 + a \times Rab} \quad (3)$$

where $Rac_2$ and $Rdiff_2$ are the resistance of the resistive connection between the power supply and the signal line, and the termination resistance for the differential signal line, respectively, when the factor "a" for the scattering of device parameters due to the process instability is taken into account.

The terminator circuit 7 of the present embodiment keeps the resistance Rx between the medium node and the power supply Vcc by the feedback control of the differential circuit 15 in the control unit 14. Therefore, the resistance $Rac_2$ of the resistive connection between the signal line and the power supply Vcc becomes, when the process instability is taken into account:

$$Rac_2 = 2 \times Rx - \frac{a \times Rab}{2} \quad (4)$$

Inserting equation (4) into equation (3), we obtain:

$$Rdiff_2 = \frac{2 \times a \times Rab \times \left(2 \times Rx - \frac{a \times Rab}{2}\right)}{2 \times \left(2 \times Rx - \frac{a \times Rab}{2}\right) + a \times Rab} \quad (5)$$
$$= a \times Rab \times \left(1 - \frac{a \times Rab}{4 \times Rx}\right)$$

As shown in equation (5), there are various combinations of the resistance Rab with the resistance Rx to get the resistance $Rdiff_2$. Therefore, setting the input termination resistance $Rdiff_2$ to be 100Ω, which is quite popular value for the transmission line for a differential signal, we may optionally combine the resistance Rab with the other resistance Rx.

Figure 2:
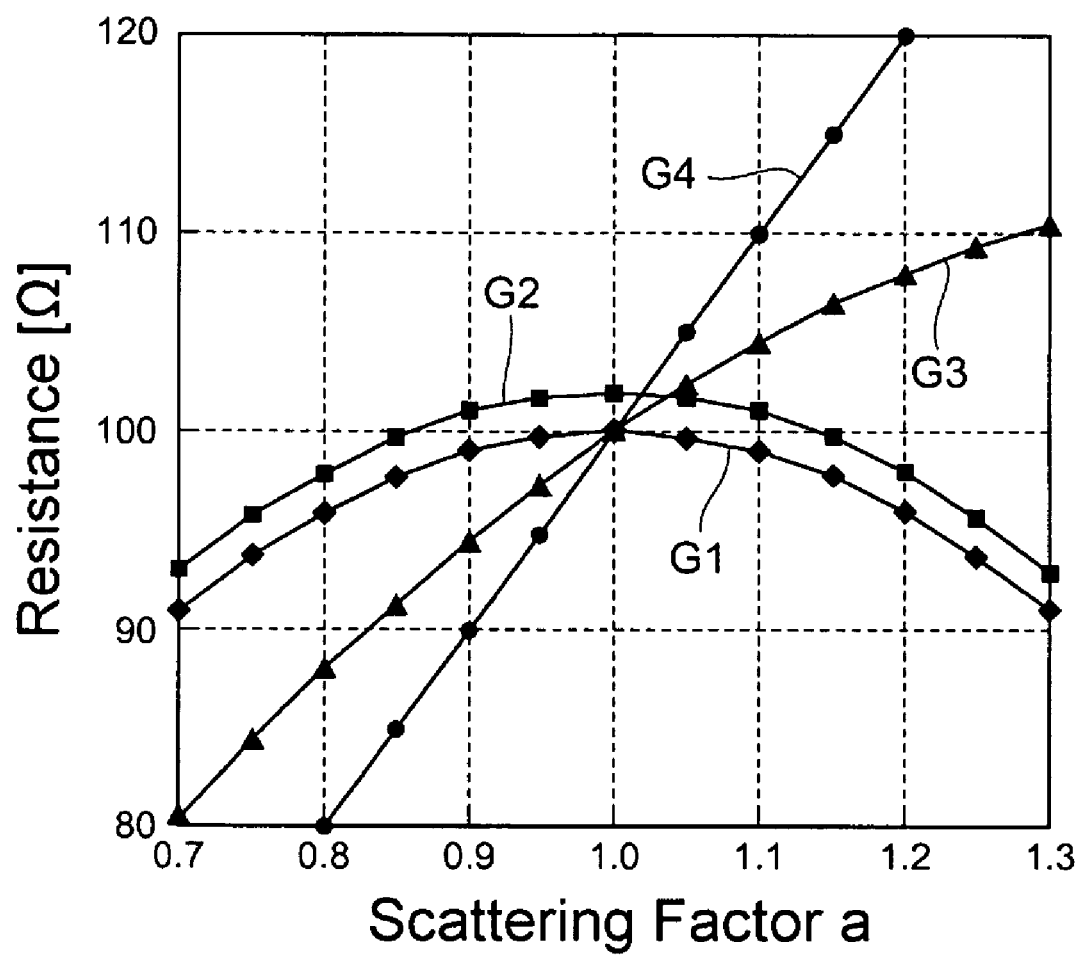
FIG. 2 shows behaviors of the differential input resistance $Rdiff_2$, which is the termination resistance of the differential signal line, with respect to a factor "a" corresponding to a fluctuation of device parameters due to the process instability.

FIG. 2 shows behaviors of the differential input resistance $Rdiff_2$, which is the termination resistance of the differential signal line, with respect to the scattering factor "a". In FIG. 2, the behaviors G1 to G3 correspond to combinations of Rab=200[Ω] and Rx=100[Ω], Rab=204[Ω] and Rx=101[Ω], and, Rab=150[Ω] and Rx=112.5[Ω], respectively. The behavior G4 shows a case where the termination resistors are formed by the film resistor operated without any feedback control shown in FIG. 1, which directly reflects the scattering of device parameters due to the process instability.

The behaviors, G1 to G3 show relatively narrower variation width compared to the behavior G4. That is, the behavior G1 shows the variation width smaller than 10% with respect to the design center, 100Ω, for the scattering factor from 0.7 to 1.3. The behavior G2 shows the maximum resistance of 102Ω at the center, which makes an error even when the device parameters show no scattering. However, the deviation from the design center, which is 100[Ω], same as the behavior G1, shows still narrower than the conventional case, the behavior G4. Moreover, for the behavior G3, although the variation width is larger compared to the former two cases, the width itself may be smaller than that of the conventional case, G4.

Figure 3:
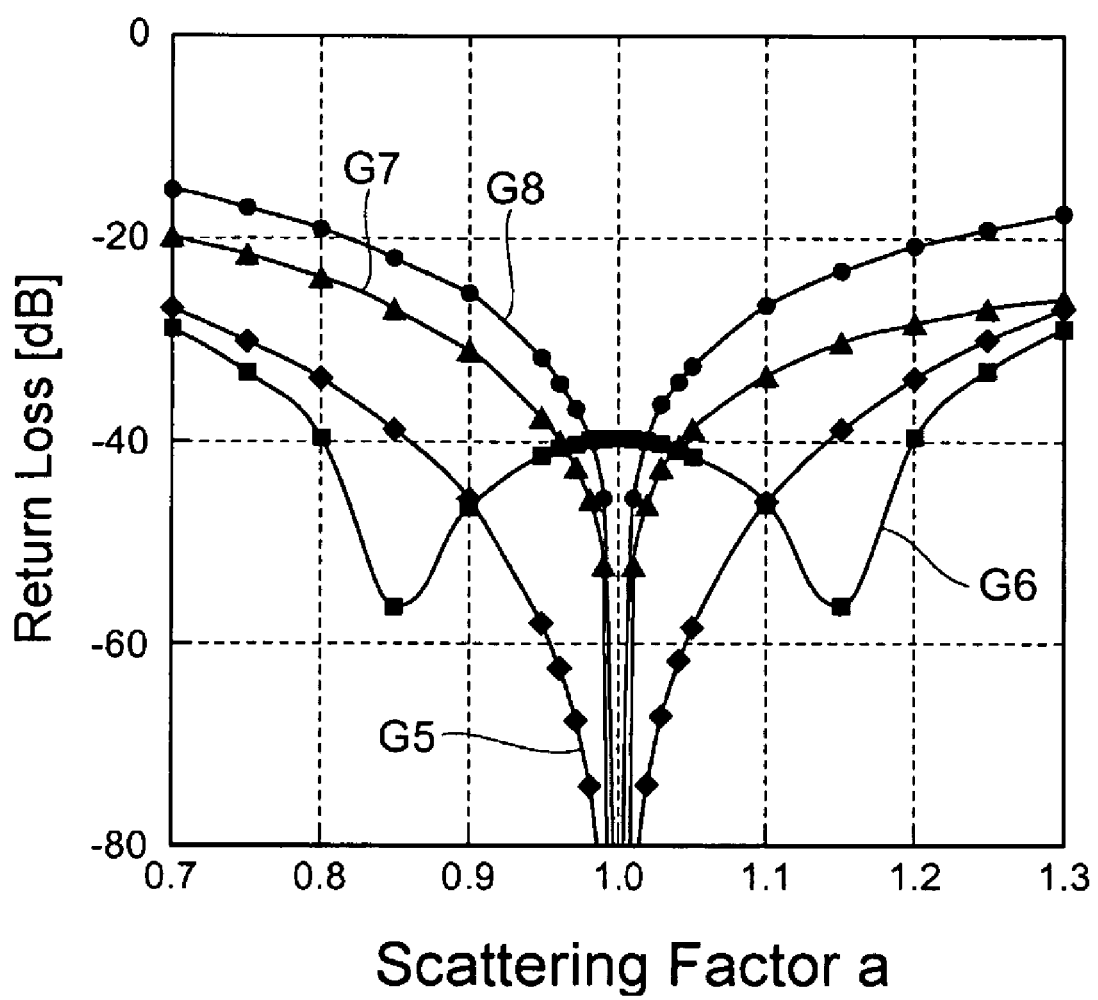

FIG. 3 shows the relation of the return loss of the differential circuit 1a for the scattering factor "a". Behaviors G5 to G8 in FIG. 3 each corresponds to the behaviors, G1 to G4, in FIG. 2, respectively. The return loss is evaluated by the following equation (6):

$$LOSS[\text{dB}] = 20 \times \log\left(\frac{Z_O - Z_i}{Z_O + Z_i}\right) \quad (6)$$

In equation (6), Zo denotes the characteristic impedance of the signal line, while, Zi is practical resistance of the termination resistor corresponding to the vertical axis in FIG. 2.

As shown in FIG. 3, the behavior G6, the case of Rab=204[Ω] and Rx=102[Ω], secures the return loss below −40 dB within the normalized scattering factor for the device parameter from 0.8 to 1.2, while, the behavior G5, corresponding to the case of Rab=200[Ω] and Rx=100[Ω], and the behavior G7, corresponding to the case of Rab=150[Ω] and Rx=112.5[Ω], decrease the return loss compared to the conventional case denoted by the behavior G8 within the range of the scattering factor from 0.7 to 1.3.

In the differential circuit 1a of the present invention, the total resistance of the first resistive connection including the first transistor 12a and two resistors, 11a and 11c, and the total resistance of the second resistive connection including the second transistor 12b and other two resistors, 11b and 11d, reflect the reference potential Vref on the medium potential Vmon between two resistors, 11a and 11b. The differential circuit 1a provides the gate bias Vg to the transistors, 12a and 12b, by the control unit 14 so as to equalize the medium potential Vmon with the reference potential Vref. Thus, the resistance of two resistive connections each including these transistors, 12a and 12b, may be precisely controlled so as to be equal to a preset resistance. The feedback loop of the control unit 14, the transistors, 12a and 12b, and the resistors, 11a to 11d, includes the termination resistor; accordingly, the resistance of the termination resistor may be precisely controlled independent on the scattering of the device parameters due to the process instability; or on the fluctuation appeared in the power supply.

The terminator circuit 7 may provide resistors, 11c and 11d, each connected in series with the transistors, 12a or 12b, as the present embodiment. In this configuration, the termination of the first terminal 2 is constituted by the transistor 12a and the resistor 12c, while, the termination of the second terminal 3 is constituted by the transistor 12b and the resistor 11d, which may narrower the variation width of the termination resistor; accordingly, the resistance of the termination resistor may be further precisely controlled.

Figure 5:
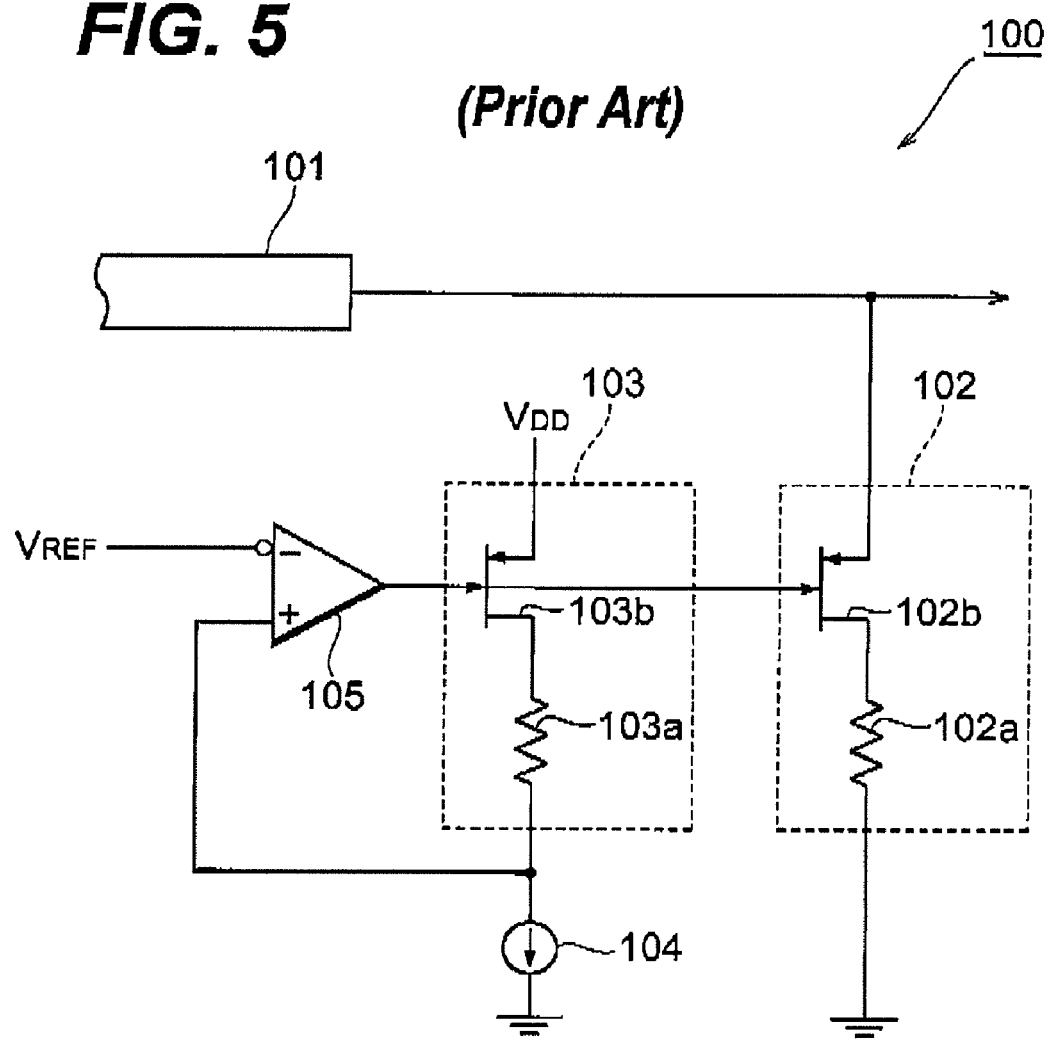
FIG. 5 shows a conventional termination circuit 100.

The high frequency characteristic of the terminator circuit 7 depends on the transistors, 12a and 12b, in particular, depends on the sizes of these transistors. Setting Rx=100[Ω] and Rab=200[Ω], Rac and Rbc become 100[Ω]. However, when a half of the resistance, Rac or Rbc is assigned to the equivalent resistance of the transistors, 12a and 12b, by taking the scattering of the device parameters into account, the resistance between current terminals of each transistor, 12a or 12b, becomes 50[Ω]. For the conventional terminator shown in FIG. 5, because the terminator 100 configures a single phase, the required resistance for the transistor becomes 25[Ω] under a similar condition that the half resistance of the resistor is assigned to the transistor, which is further smaller than the present condition.

Considering the operation of the MOSFET in the linear region, the equivalent resistance between the current terminals, the drain and the source, becomes:

$$Rmos = \frac{1}{\mu \times C_{OX} \times \frac{W}{L}(V_{gs} - V_{th})} \quad (7)$$

where $\mu$, $C_{OX}$, W, L, Vgs, and Vth are the electron mobility, the capacitance of the Gate insulating film, the gate width and the gate length, the bias applied to the gate with respect to the source, and the threshold voltage of the MOSFET. In order to reduce the resistance between the drain and the source electrodes, the ratio W/L must be enlarged when the process of this MOSFET is unchanged. However, the larger ratio W/L brings the increment of the diffusion capacitance, which degrades the high frequency performance of the device. Thus, the terminator circuit 7 according to the present invention shows a high frequency performance superior to those 100 realized in the conventional terminator shown in FIG. 5 because the transistor applied therein may have a smaller ratio W/L.

Second Embodiment

Figure 4:
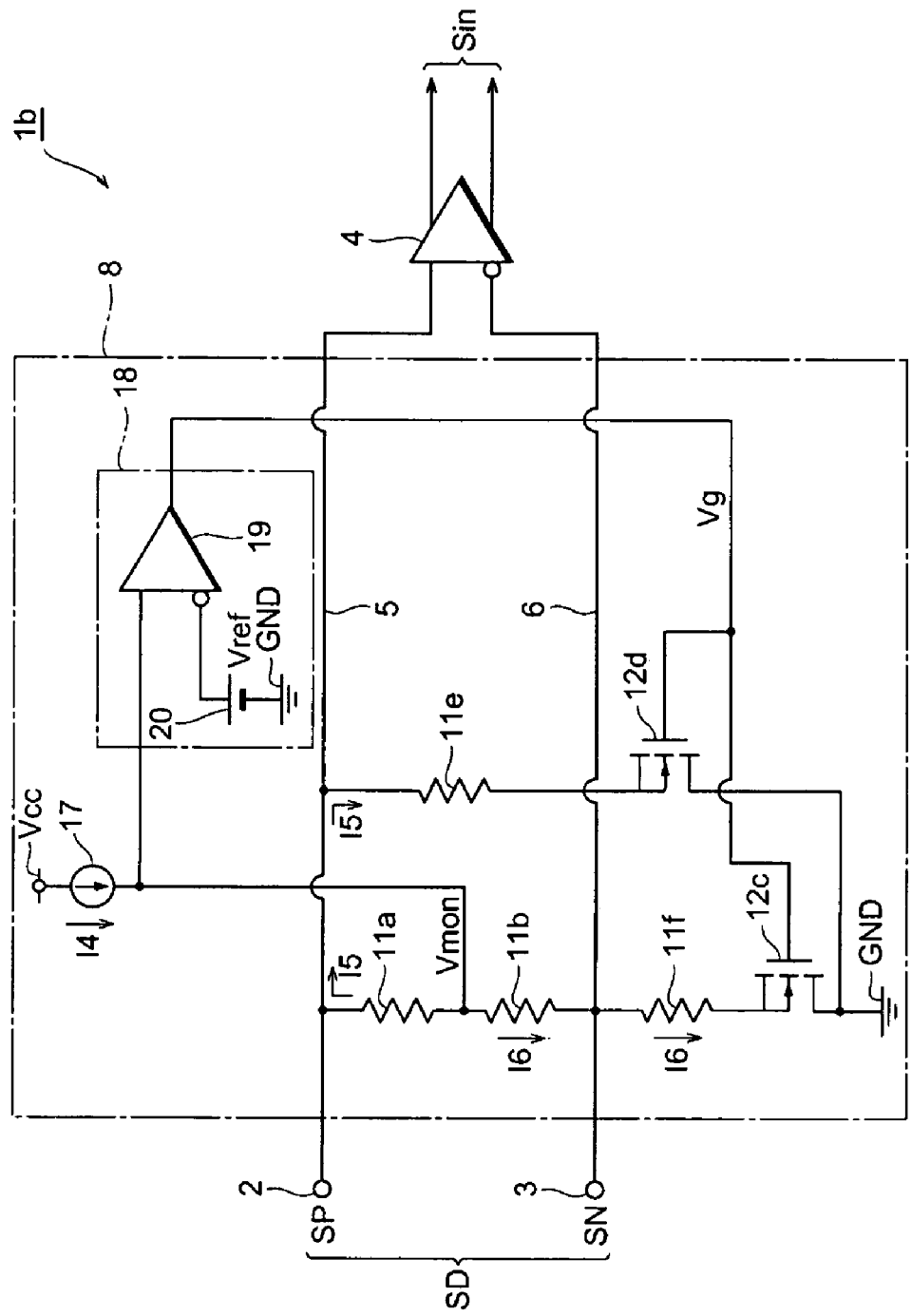
FIG. 4 is a circuit diagram of a differential circuit according to the second embodiment of the present invention.

FIG. 4 is a circuit diagram of a differential circuit 1b according to the second embodiment of the present invention. The circuit 1b provides the first 2 and the second 3 input terminals, the amplifier 4 and the terminator circuit 8. Elements in FIG. 4 except for the terminator circuit 8 are same with those appeared in the first embodiment.

The terminator circuit 8 includes the first 11a and the second 11b resistors with the same configuration as the first embodiment, and the third 11e and the fourth 11f resistors, two transistors, 12c and 12d, the constant current source 17 and the control unit 18 with a different configuration from those of the first embodiment shown in FIG. 1.

The transistor 12c, which is the first transistor in the present embodiment, operates as a variable resistor between the first input terminal 2 and the ground GND. That is, the drain of the transistor 12c is connected to the first signal line 5 through the resistor 11e, while, the source thereof is connected to the ground GND. Accordingly, the first input terminal 2 is grounded via the first resistive connection of the transistor 12c and the resistor 11e connected in series with the transistor 12c.

The other transistor 12d, which is the second transistor in the second embodiment, operates as another variable resistor between the second input terminal 3 and the ground GND. Specifically, the drain of the transistor 12d is connected to the second signal line 6 through the resistor 11f whose resistance is the same as that of the other resistor 11e, while, the source thereof is grounded. Thus, the second input terminal 6 is grounded via the second resistive connection of the transistor 12d and the resistor 11f connected in series with the transistor 12d.

Two transistors, 12c and 12d, has the same dimension in the gate length and the gate width within the IC ship. Although FIG. 4 explicitly depicts the n-MOSFET, the terminator circuit 8 may apply another type of FETs or bipolar transistors. Moreover, although two resistors, 12c and 12d, are connected between each transistor, 12c or 12d, and the signal line, 5 or 6, these resistors may be connected between the ground and respective transistors, 12c and 12d.

The constant current source 17, which is inserted between the power supply line Vcc and the medium node between two resistors, 11a and 11b, to provide a constant current I4 to the medium node. The terminator circuit 8 of the present embodiment provides two resistive connections between the medium node and the ground, one of which is constituted by the transistor 12c and two resistors, 11a and 11e, where these circuit elements are connected in series with each other, the other of which is constituted by the transistor 12d and two resistors, 11b and 11f, connected in series with respect to each other. Moreover, the resistance of these two resistive connections are set to be equal to the others; accordingly, the current I5 flowing in the first resistive connection and the other current I6 flowing in the second resistive connection become a half of the current I4 provided from the constant current source 17. The current I4 from the current source is preferably independent on the ambient temperature or on the variation of the power supply Vcc.

The control unit 18 provides the gate bias Vg to the transistors, 12c and 12d by receiving the voltage Vmon of the medium node so as to maintain the voltage Vmon constant. The control unit 18 includes an operational amplifier 19 with the non-inverting input connected to the medium node between two resistors, 11a and 11b, and with the inverting input connected to the voltage source 20 for the reference Vref. The operational amplifier 19 outputs the gate bias Vg to the transistors, 12a and 12d, so as to equalize the voltage Vmon of the medium node to the reference Vref.

Next will explain the operation of the differential circuit 1b. In the terminator circuit 8, the transistor 12d with the resistor 11e operates as the terminator for the first input terminal 2, while the other transistor 12e with the resistor 11f operates as the terminator for the second input terminal 3. Because the terminator circuit 8 provides two resistive connections, a series connection of the transistor 12d and two resistors, 11b and 11f, and another series connection of the transistor 12e and two resistors, 11c and 11e, and they are connected in parallel between the medium node and the ground. Accordingly, the voltage Vmon of the medium node may be determined by the current I4 provided from the current source 17 multiplied with the parallel resistance of these two resistive connections.

In the terminator circuit 8, the control unit 18 equalizes this medium voltage Vmon with the reference Vref by providing the gate bias Vg to the transistors, 12c and 12d, which dynamically and precisely varies the equivalent resistance of the transistors. Thus, the terminator circuit 8 provides the termination resistor contained within the feedback loop, which may enhance the preciseness of the termination resistance independent on the scattering of the device parameters of the transistor and the resistor due to the process instability, or the fluctuation of the power supply.

While the preferred embodiments of the present invention have been described in detail above, many changes to those embodiments may be made without departing from the true scope and teachings of the present invention. For instance, the embodiments provide the ground and the power supply line as the constant reference potential. However, two reference potential with different potential to each others not restricted to the ground and the power supply line may be applicable to the present invention. Furthermore, although the embodiments above explain that the transistors and the resistors are integrated on the single chip, discrete transistors and resistors may also be used in the present terminator circuit. The present invention, therefore, is limited only as claimed below and the equivalents thereof.

I claim:

1. A differential circuit with a termination circuit for a positive phase signal received at a first input terminal and a negative phase signal received at a second input terminal, said termination circuit comprising:
   a first resistive connection including a first transistor operated as a variable resistor, and a first resistor connected in series with a third resistor, said first transistor being connected between a first power supply and said third resistor, said third resistor being connected between said first transistor and said first input terminal, said first resistor being connected between said first input terminal and a medium node;
   a second resistive connection including a second transistor operated as a variable resistor, and a second resistor connected in series with a fourth resistor, said second transistor being connected between said first power supply and said fourth resistor, said fourth resistor being connected between said first transistor and said second input terminal, said second resistor being connected between said second input terminal and said medium node;
   a constant current source connected between said medium node and a second power supply to cause a current in said first resistive connection and another current in said second resistive connection with a sum of said current and said another current being constant;
   a differential amplifier connected to said first input terminal and said second input terminal; and
   a control unit configured to provide a control signal to said first transistor and said second transistor so as to equalize a voltage of said medium node with a reference voltage,
   wherein said first and second transistors, and said first and second resistors are integrated within a same IC chip.

2. The differential circuit according to claim 1, wherein said first power supply is a positive power supply and said second power supply is a ground.

3. The differential circuit according to claim 2, wherein said first and second transistors are a p-type MOSFET with a same configuration in a gate width and a gate length thereof.

4. The differential circuit according to claim 1, wherein said first power supply is a ground and said second power supply is a positive power supply.

5. The differential circuit according to claim 4, wherein said first and second transistors are an n-type MOSFET with a same configuration in a gate width and a gate length thereof.

* * * * *